(12) United States Patent
Pendse

(10) Patent No.: US 6,417,573 B1
(45) Date of Patent: Jul. 9, 2002

(54) HIGH TEMPERATURE FLIP CHIP JOINING FLUX THAT OBVIATES THE CLEANING PROCESS

(75) Inventor: Rajendra D. Pendse, Fremont, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/531,547

(22) Filed: Mar. 20, 2000

Related U.S. Application Data

(62) Division of application No. 09/057,430, filed on Apr. 8, 1998, now Pat. No. 6,059,894.

(51) Int. Cl.[7] .............................................. H01L 29/40
(52) U.S. Cl. ...................................... 257/778; 257/782
(58) Field of Search ................................ 257/737, 738, 257/778, 782, 783

(56) References Cited

U.S. PATENT DOCUMENTS

| | | | | |
|---|---|---|---|---|
| 5,052,612 A | * | 10/1991 | Tecle | 228/207 |
| 5,656,862 A | * | 8/1997 | Papathomas et al. | 257/778 |
| 6,020,638 A | * | 2/2000 | Kobayashi | 257/738 |
| 6,127,731 A | * | 10/2000 | Hoffmeyer | 257/750 |

* cited by examiner

*Primary Examiner*—Roy Potter

(57) ABSTRACT

A fluxing composition is disclosed. The composition comprises a high molecular weight carboxylic acid that forms a combination of carboxylate salts and unreacted acid anhydrides when applied to a solder alloy and exposed to temperatures in the range of about 150 to 350° C. in an inert atmosphere and a carrier fluid comprising a mixture of organic solvents that is heat stable and non-reactive with the solder alloy and has a high viscosity at room temperature. Also disclosed is an integrated circuit assembly comprising an integrated circuit comprising a chip attached to a substrate by a plurality of solder joints and a thin layer of a residue comprising the carboxylate salts and acid anhydride. The film of residue is formed concomitantly with the formation of the solder joints during the reflow cycle. Since the residue is reactive with an epoxy used in bonding the chip to the substrate, the usual process step of cleaning the flux residue prior to dispensing the epoxy is obviated. Methods for preparing a bonded pair of surfacer are also disclosed.

3 Claims, 1 Drawing Sheet

HIGH TEMPERATURE FLIP CHIP JOINING FLUX THAT OBVIATES THE CLEANING PROCESS

CROSS REFERENCE TO RELATED APPLICATION(S)

This is a divisional of application Ser. No. 09/057,430 filed on Apr. 8, 1998 now U.S. Pat. No. 6,059,894.

BACKGROUND OF THE INVENTION

1. Field of the Invention

This invention relates generally to the area of solder fluxes such as those used in the microelectronics area, for example, in flip chip joining, sometimes referred to as C4 (controlled collapse chip connection) joining.

A common task in the manufacture of microelectronic components involves the manufacture of single chip or multi-chip modules having solder bumps or input/output pins, which are inserted into a substrate. The solder bumps or input/output pins provide the needed electrical connections to the integrated circuit chip or chips, which are subsequently connected to the substrate or carrier. In other presently known manufacturing processes, a chip is soldered directly to a printed circuit board. With either process, solder flux compositions have typically been applied in order to connect the component to the selected substrate, for instance, the printed circuit board. Flux compositions have been employed to remove oxides from the pins and to prevent the pins from oxidizing when subjected to elevated temperatures for soldering, thereby serving to maintain the electrical conductivity of the pins. Once the solder is applied, any flux compositions or residue remaining on the surfaces of the chip and/or substrates must be removed to provide as clean a substrate as possible. In the past, this has meant that an extra step of flux removal was necessary in the manufacturing process.

The soldering operation, in general, and flux removal, in particular, is increasingly difficult when applied to microelectronics. The pieces to be joined are extremely small, making cleaning, tinning, postcleaning and inspection difficult. In some cases, to avoid over heating, only the lead portion of the parts to be joined can be heated during the soldering operation. Cleaning and postcleaning are difficult due to the small size of the component, their large numbers, and the potential damage to the electronics by the cleaning solutions used, if any. Another problem source results from the fact that many of the known soldering fluxes are corrosive. In the environment of microelectronics, corrosion from any residual flux can ruin an extremely costly device.

Organic fluxes are typically based on water-insoluble rosin or water-soluble organic acid. Activated rosin fluxes are used in soldering electrical connections on printed circuit boards. Wave soldering is used for mass production circuit board soldering as by applying the flux, preheating the board, applying the solder, cooling the board and cleaning it to remove flux residue.

The flux residue usually comprises ionic (e.g., acidic or basic) substances, and is corrosive, or can hydrolyze to corrosive constituents in the presence of moisture. This can lead to short circuits, noise generation, etc., in the use of the circuit board product. These adverse results are effectively avoided by subjecting the soldered board to a cleaning step to remove the ionic substances.

Many of the organic water-soluble fluxes presently available contain corrosive materials such as halides. A flux composition that contains free halogen can result in conversion to hydroacids and corresponding halide ions by hydrolysis at the soldering temperature. Hydroacids can further react with organic materials present in the flux to free halide ions. Accordingly, if the flux residue is not entirely removed, it will lead to corrosion of the parts soldered.

Because of these problems, so-called "non-activated" rosin fluxes have been used in the past in the microelectronic environment. This has not generally provided an acceptable solution, however, since the pure rosin alone is limited in oxide removal capability and can require rework to produce an acceptable product.

To improve the pure rosin flux oxide removal capability, a number of "activated" or "mildly activated" rosin fluxes have been developed. These products have several shortcomings, including the necessity of a cleaning step to ensure the removal of corrosive agents left behind after the soldering operation. For instance, it was often necessary to employ a hot water rinse in combination with neutralization or a mild hydrochloric acid solution in combination with a hot water rinse and neutralization or to use specialized water-based detergents. These cleaning steps caused difficulties during the assembly of chips to integrated circuit board where the low stand-off height of the chip to the substrate made it extremely difficult to clean underneath the chip with an aqueous or non-solvent process.

Other of the commercially available low residue fluxes have proved to be too thin, running out from under the chip during the manufacturing operation and failing to hold it in place. In other approaches a soldering flux is used that thermally dissipates after solder reflow so that no visible residue is left on the printed circuit substrate that would be visible with conventional inspection techniques such a light microscopy, or visual inspection at low powers of magnification.

Flip chip joining is the most viable interconnect scheme for high pin count single chip packages. The conventional process for performing such joining, practiced for many years by IBM and popularly known as "C4," involves the use of a rosin-based flux, reflow in a hydrogen environment at approximately 350° C., and cleaning of the flux residue using an aggressive solvent, such as hot xylene. In order to facilitate the adoption of C4 technology for cost-sensitive high pin count ASIC products, simplification of the overall process complexity and cost is considered to be critical. Notably, the facilitization of safe hydrogen environments, solvent cleaning equipment and the handling of aggressive chemicals is quite atypical of most package assembly environments and such factors present expensive entry barriers to the technology.

The formation of a flux residue during C4 joining is predominantly attributable to the presence of rosin in most commercial fluxes. The rosin, which is a distillation product of certain natural tree saps, is composed chiefly of abietic acid, which is known to decompose and transform to other more inert forms in the vicinity of 300° C., which is below the typical peak C4 reflow temperature (namely, 350° C.). The reaction products form the so-called flux residue, which by its chemical stability requires aggressive solvents for its removal. The presence of hydrogen greatly reduces this phenomenon by suppressing the transformation in abietic acid and, therefore, to implement the C4 joining process, IBM typically has used hydrogen environments.

2. Description of the Related Art

U.S. Pat. No. 5,334,260 (Stefanowski 1) and U.S. Pat. No. 5,281,281 (Stefanowski 2) disclose a no-clean, low residue, volatile organic compound free soldering flux and method of use.

Schneider, et al., discuss a rosin-free, low VOC, no-clean soldering flux and method or using the same in U.S. Pat. No. 5,571,340.

U.S. Pat. No. 5,417,771 (Arita, et al.) discloses a soldering flux.

A soldering flux composition is disclosed by Roberts in U.S. Pat. No. 4,360,392.

Mace, et al., discusses a thermally dissipated soldering flux in U.S. Pat. No. 5,004,508.

Takemoto, et al., discloses a soldering flux composition in U.S. Pat. No. 5,211,763.

U.S. Pat. No. 4,988,395 (Taguchi, et al.) discusses a water-soluble soldering flux and paste solder using the flux.

A tacky, no-clean thermally dissipated soldering flux is disclosed by Gutierrez, et a., in U.S. Pat. No. 5,129,962.

Minihara, et al., discloses a soldering flux composition and solder paste composition in U.S. Pat. No. 5,334,261.

A processing method for the manufacturing of electronic components using a soft soldering flux based on carboxylic acid is discussed in U.S. Pat. No. 5,116,432.

Schneider, of et al., discuss a no-clean soldering flux and method of using the same in U.S. Pat. No. 5,297,721.

U.S. Pat. No. 4,278,479 (Anderson, et al.) discloses an organic acid activated liquid solder flux.

SUMMARY OF THE INVENTION

One embodiment of the present invention is a fluxing composition comprising a high molecular weight carboxylic acid that forms a combination of carboxylate salts and unreacted acid anhydrides when applied to a solder alloy and exposed to temperatures in the range of about 150 to 350° C. in an inert atmosphere and a carrier fluid comprising a mixture of organic solvents that is heat stable and non-reactive with the solder alloy and has a high viscosity at room temperature.

Another aspect of the present invention is a fluxing composition comprising (a) a mixture comprising a monocarboxylic acid having at least 8 carbon atoms, a hydroxycarboxylic acid and a dicarboxylic acid, the mixture forming a combination of carboxylate salts and unreacted acid anhydrides when applied to a lead-tin solder alloy and exposed to temperatures in the range of about 150 to 350° C. in an inert atmosphere, and (b) a carrier fluid comprising a mixture of organic solvents comprising an alcohol, a dihydroxyalkane of from 2 to 6 carbon atoms, and a dihydroxypolyether of from 4 to 8 carbon atoms. The carrier fluid is heat stable and non-reactive with the solder alloy. The flux composition has a viscosity of about 6000 to about 8500 centipoise at room temperature.

Another aspect of the present invention is an integrated circuit assembly comprising an integrated circuit comprising a chip attached to a substrate by a plurality of solder joints and a thin layer of a residue that is reactive with an epoxy used in bonding the chip to the substrate.

Another aspect of the present invention is a method for preparing a bonded pair of surfaces. A thin film of a flux residue is prepared on at least a portion of one or both surfaces to be bonded. The residue is reactive with an epoxy used to bond the surfaces wherein the epoxy lies between the two surfaces. The epoxy is cured in the presence of the residue under conditions sufficient to cause the bonding of the epoxy to the surfaces.

DETAILED DESCRIPTION OF THE INVENTION

Figure 1:
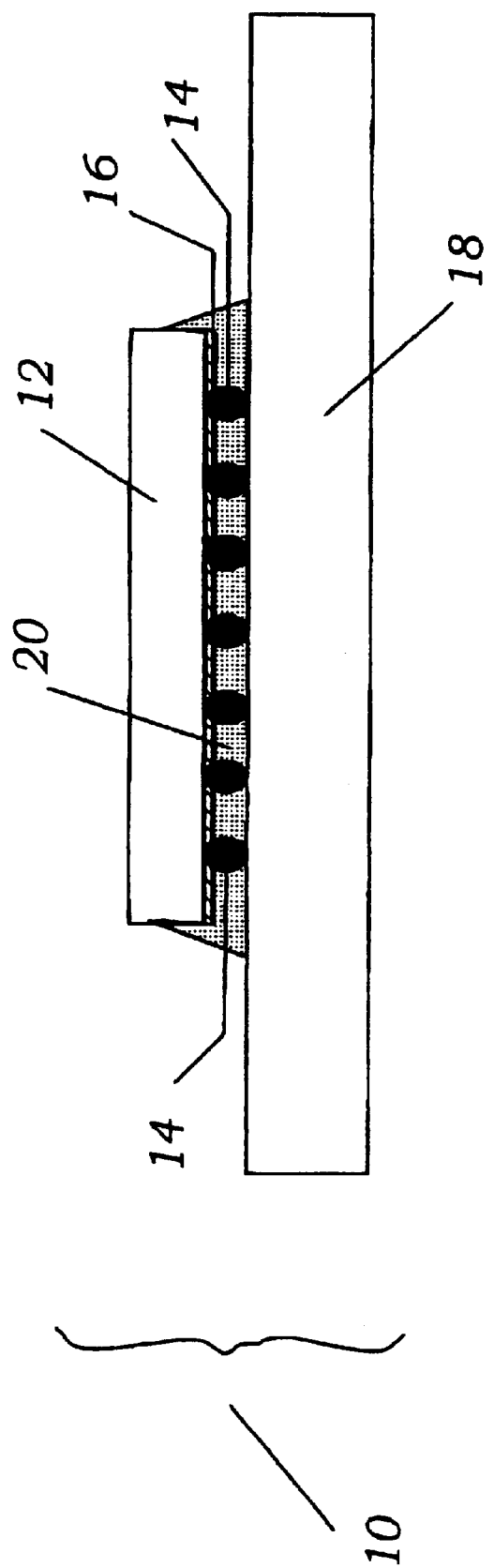
FIG. 1 is a schematic diagram depicting an integrated circuit assembly in accordance with the present invention.

The present invention provides a flux composition that solves the problems mentioned earlier. The flux composition of the present invention permits good joining quality between solder surfaces, such as solder bumps, and substrate even when the assembly of solder bumps and substrate is reflowed in a nitrogen environment. The fluxing composition leaves a minimal amount of flux residue after the reflow cycle. The chemical structure of the flux residue allows cleaning using more benign alcohol-based solvents. More notably, the physico-chemical structure of the flux residue provides good adhesion to anhydride-curing underfill epoxies by participating in the curing reaction. By virtue of this latter characteristic, the flux cleaning process can be eliminated altogether without sacrificing solder joint reliability. The flux composition of the present invention is substantially free from rosin, which means that the flux composition contains less than about 5%, preferably, less than about 1%, more preferably, 0%, of rosin. The term "reflow" means subjecting the assembly to a temperature-time profile suitable to melt the solder and form solder joints as is customary in the art.

As mentioned above one aspect of the present invention is a fluxing composition comprising a high molecular weight carboxylic acid. The carboxylic acid is chosen on the basis of its ability to form a residue that comprises a combination of carboxylate salts and unreacted acid anhydrides when applied to a solder alloy and exposed to temperatures in the range of about 150 to 350° C. in an inert atmosphere. The carboxylic acid desirably has the ability to dissolve oxides of the metals of the solder alloy such as oxides of tin and lead. The flux composition also comprises a carrier fluid in which the carboxylic acid is held. The carrier fluid has the characteristics of high temperature stability and weakly polar molecular structure to provide miscibility of the carboxylic acid. The carrier fluid usually comprises a mixture of organic solvents that is heat stable and non-reactive with the solder alloy and has a high viscosity at room temperature. The carboxylic acid should be miscible in the carrier fluid. This means that the carboxylic acid should dissolve in the carrier fluid at least to the extent of about 5%, preferably, at least about 8%. There should not be a substantial formation of a reaction product of the carrier fluid and the metals of the solder alloy. This means that any such reaction product should not be greater than about 10%, preferably, not greater than about 5%, more preferably, not greater than about 1%, of the total residue formed.

The high molecular weight carboxylic acid usually is a monocarboxylic acid and has at least about 8 carbon atoms and may have as many as about 24 carbon atoms, more usually about 12 to 24 carbon atoms. Examples of suitable monocarboxylic acids, by way of illustration and not limitation, are caprylic acid, capric acid, lauric acid, myristic acid, palmitic acid, stearic acid, oleic acid, linoleic acid, linolenic acid, undecanoic acid, tridecanoic acid, pentadecanoic acid, margaric acid and the like.

In a preferred embodiment a mixture of carboxylic acids is employed. The mixture comprises a monocarboxylic acid having at least 8 carbon atoms, a hydroxycarboxylic acid and a dicarboxylic acid. The mixture forms a combination of carboxylate salts and unreacted acid anhydrides when applied to a solder alloy and exposed to temperatures in the range of about 150 to 350° C. in an inert atmosphere. Examples of suitable hydroxycarboxylic acids, by way of illustration and not limitation, are hydroxyacetic acid (glycolic acid), hydroxy propionic acid, hydroxybutyric acid, hydroxypentanoic acid, and the like wherein the hydroxy group is preferably on the α or β carbon atom but may be on other carbon atoms in those hydroxycarboxylic acids having more than four carbon atoms. Examples of suitable dicarboxylic acids, by way of illustration and not limitation, are malonic acid, succinic acid, glutaric acid, adipic acid, pimelic acid, suberic acid, azelaic acid sebacic acid, undecanedicarboxylic acid, dodecanedicarboxylic acid, tridecanedicarboxylic acid, tetradecanedicarboxylic acid, maleic acid, fumaric acid, and the like.

As mentioned above, the carboxylic acid is chosen on the basis of its ability to form a combination of carboxylate salts and unreacted acid anhydrides when applied to a solder alloy and exposed to temperatures in the range of about 150 to 350° C. in an inert atmosphere. The carboxylate salts are salts of the metals that are found in the solder employed. For lead-tin alloys, which usually contain about 60% tin and 40% lead, the carboxylate salts formed are those of lead and tin. The solder alloys may also contain additional constituents such as silver and antimony, usually, less than 5%. However, the above phrase "carboxylate salts" refers primarily to the metals that form the major constituents of the solder alloy employed. Lead-free solder systems are also known such as tin-bismuth, and the like. The term "unreacted anhydrides" means that an acid anhydride formed by dehydration of the carboxylic acid has not as yet reacted with the solder. By the term "inert atmosphere" is meant that the atmosphere employed contains less than about 50 parts per million (ppm) of oxygen, usually less than 25 ppm, preferably, less than 10 ppm of oxygen. The inert atmosphere usually comprises an inert gas such as nitrogen, hydrogen, argon, and the like.

The carboxylic acid or mixtures thereof are present in a carrier fluid. The carrier fluid usually comprises a mixture of organic solvents that is heat stable and non-reactive with the solder alloy. An important characteristic of the organic solvents that comprise the carrier fluid is that they have a viscosity such that the resulting flux composition has a high viscosity at room temperature. Typically, the flux composition has a viscosity of about 6000 to about 8500 centipoise at room temperature. By the term "room temperature" is meant about 15 to 25° C., usually, about 20° C.

The carrier fluid generally comprises a mixture of organic solvents to achieve the above-mentioned viscosity of the flux composition. The carrier fluid usually comprises an alcohol, a dihydroxyalkane and a dihydroxypolyether. The carrier fluid contains less than about 2% of water. The absence of water from the carrier fluid of the present invention promotes the formation of anhydrides that are reactive in the curing process of an epoxy as mentioned above. The carrier fluid is heat stable and non-reactive with the solder alloy. The alcohol normally has at least 3 carbon atoms, more usually, about 3 to 20 carbon atoms. Examples of such alcohols, by way of illustration and not limitation, are propanol, butanol, pentanol, hexanol, heptano), octanol, nonanol, and decanol including the various isomeric forms thereof such as, e.g., n-propyl alcohol, isopropyl alcohol, n-butyl alcohol, isobutyl alcohol, tertiary butyl alcohol, n-pentanol, isopentanol, and so forth and mixtures thereof.

The dihydroxyalkane, sometimes referred to as dihydroxyalcohol, usually has at least 2 carbon atoms, more usually, about 2 to 6 carbon atoms. Preferred are vicinal dihydroxyalcohols such as glycols, for example, ethylene glycol, propylene glycol, butylene glycol, hexylene glycol, and the like. It is within the purview of the present invention to use more than one dihydroxy alcohol in the carrier fluid.

The dihydroxypolyether usually has from 4 to 8 carbon atoms, preferably, about 4 to 6 carbon atoms. The dihydroxy polyether generally has the formula $HO(CH_2CH_2O)_nH$ wherein n is 2 to 4, preferably 2 to 3. The polyether component of the carrier fluid may be a single dihydroxypolyether or a mixture of one or more of the aforementioned dihydroxy polyethers.

The flux composition usually contains from about 6 to about 10% by weight of the carboxylic acid. When a mixture of carboxylic acids is used, the mixture generally contains about 35 to about 55%, preferably, about 50% by weight of the monocarboxylic acid, about 10 to about 40%, preferably, about 25% by weight of the hydroxycarboxylic acid, and about 10 to about 40% preferably, about 25% of the dicarboxylic acid.

The carrier fluid is present in the flux composition in about 80 to 94% by weight, preferably, about 90 to about 94% by weight. The components of the carder fluid are usually present as follows: dihydroxyalcohol in about 60 to about 90%, preferably, about 80% by weight, alcohol in about 5 to about 20%, preferably, about 10% by weight, and dihydroxypolyether in about 5 to about 20%, preferably, about 10% by weight. It should be kept in mind that the amounts and nature of the organic solvents in the carrier fluid are selected so as to achieve a heat stable, high viscosity flux composition as mentioned above. Furthermore, selection of the components of the carrier fluid is also governed by the desired boiling point of the carrier fluid, namely, about 150 to about 350° C.

The fluxing composition may optionally comprise an inert surfactant in an amount of about 0.5 to about 2% by weight. By the term "inert surfactant" is meant an agent that does not react with solder and reduces the surface tension of the flux. The inert surfactant may be, for example, a nonionic surfactant or a mixture of nonionic surfactants. Particular examples of an inert surfactant that may be employed in the flux composition of the present invention are phenoxypolyethoxy ethanols, perfluoroalkyl alcohols, glycol fatty acid esters, alkylaryl polyether alcohols, ethoxylated polyoxypropylenes, and the like.

The fluxing composition of the present invention may optionally comprise an amine activator. Preferably, the amine activator is one that reacts with an oxide of the solder alloy at a temperature below 150° C. The amine activator may be a primary, secondary or tertiary amine, preferably aliphatic, a diamine, triamine, and so forth. A preferred amine activator is an aliphatic amine having from about 1 to about 10 carbon atoms, preferably, 1 to about 6 carbon atoms such as trimethylamine, triethylamine, n-propylamine, n-butylamine, isobutylamine, sec-butylamine, t-butylamine, n-amylamine, sec-amylamine, 2-ethylbutylamine, n-heptylamine, 2-ethylhexylamine, n-octylamine, t-octylamine and the like.

A preferred fluxing composition Comprises a mixture comprising a monocarboxylic acid having at least 8 carbon atoms, a hydroxycarboxylic acid and a dicarboxylic acid. The mixture forms a combination of carboxylate salts and unreacted acid anhydrides when applied to a lead-tin solder alloy and exposed to temperatures in the range of about 150 to 350° C. in an inert atmosphere. The preferred flux composition further comprises a carrier fluid comprising a mixture of organic solvents, which are an alcohol, a vicinal dihydroxyalkane of from 2 to 6 carbon atoms, and a dihydroxypolyether of from 4 to 8 carbon atoms wherein the carrier fluid is heat stable and non-reactive with a solder alloy. The flux composition has a viscosity of about 6000 to about 8500, preferably about 6500 to about 7500, centipoise at room temperature. In a more preferred embodiment the fluxing composition comprises stearic acid, glycolic acid and adipic acid in a carrier fluid comprising isopropyl alcohol, ethylene glycol and a dihydroxypolyether of the formula $HO(CH_2CH_2O)_nH$ wherein n is 2.

The flux composition of the present invention is prepared by adding appropriate proportions of the carboxylic acid(s) and the components of the carrier fluid. The carrier fluid may be prepared separately by combining the appropriate organic solvents in proper proportion. The carboxylic acid may then be combined with the carrier fluid in the desired amounts. Where a mixture of carboxylic acids is employed, the carboxylic acids may first be combined and the combination then added to the carrier fluid. Alternatively, each carboxylic acid may be added to the carrier fluid separately in proper proportion.

The flux composition of the present invention may be employed in a method for preparing a bonded pair of surfaces. A thin film of a flux residue is prepared on at least a portion of one or both surfaces to be bonded. The residue is reactive with an epoxy used to bond the surfaces wherein the epoxy lies between the two surfaces. The epoxy is usually an anhydride-curing epoxy, which means that one of the reactions during the curing of the epoxy is the cleaving of an oxirane ring structure by virtue of the acid radical (COOH) from the anhydride group. Examples of such epoxies are, by way of illustration and not limitation, Ablestick ® 7727 (Ablestick Laboratories, National Starch and Chemical Company, Rancho Dominguez, Calif.) and Alpha Metals Heli8-05R2® (Alpha Metals-A Cookson Company, Jersey City, N.J.). The epoxy is cured in the presence of the residue under conditions sufficient to cause the bonding of the epoxy to the surfaces. The thin film of residue is prepared on one or both of the surfaces by contacting at least a portion of one or both of the surfaces with the fluxing composition followed by heating of the fluxing composition. Preferably, the film of residue is formed by a process that comprises limiting, to a period less than about 90 seconds, exposure of the fluxing composition to a temperature of about 250 to about 350° C. The portion of one surface may be a solder bump or a pin. Curing the epoxy may be accomplished by heating the uncured epoxy composition at a temperature of about 100 to about 150° C. for a period of about 30 to about 90 minutes. Accordingly, the film of flux residue is formed concomitantly with the solder joints during the reflow step.

The flux composition of the present invention finds application in any circumstance requiring a soldering flux, which applications are well known in the art. As mentioned above, the flux composition finds particular use in microelectronics such as in flip chip joining in the preparation of integrated circuit assemblies. In one embodiment, a silicon chip with solder bumps on one surface is dipped into a pool of the flux composition of the invention such that only the tips of the solder bumps pick up the fluxing composition. For purposes of the present invention, it is preferable to contact only a portion of the surface, e.g., tips of the solder bumps referred to above, with the flux composition to minimize the thickness of the film that is formed. This contact may be achieved simply by dipping only the solder bumps on the chip in the flux composition. Following the dipping step, the chip is placed on a substrate and subjected to reflow during which a thin film of residue is formed in accordance with the present invention. Subsequently, an anhydride-curing epoxy is dispensed in the region between the chip and the substrate and the epoxy is cured. Because of the nature of the film residue formed in the present invention, the epoxy step may be performed without removal of the residue and the adhesion properties of the epoxy are enhanced.

Another embodiment of the present invention is an integrated circuit assembly comprising an integrated circuit comprising a chip attached to a substrate by a plurality of solder joints and a thin layer of a residue that is reactive with an epoxy used in bonding the chip to the substrate. This is a significant advantage of the flux composition of the present invention. In the first place there is no residue that must be removed prior to the completion of the bonding operation. Secondly, the residue is reactive with the epoxy used in the bonding step, thus, yielding a stronger bond between the surfaces. As mentioned above, usually the residue comprises carboxylate salts of metals in the solder alloy and acid anhydrides. Preferably, the residue has a thickness not greater than 1000 angstroms, usually, not greater than 500 angstroms. In one embodiment the residue covers a portion of the surface formed by the exposed regions of the solder joints, the surface of the chip and the surface of the substrate. In another embodiment the above integrated circuit assembly further comprises an epoxy in the space between the surface of the chip and the surface of the substrate.

Referring to FIG. 1, integrated circuit assembly 10 has integrated circuit chip 12 with solder bumps 14 and film of flux residue 16. Chip 12 is in intimate contact with substrate or package 18. Also shown in FIG. 1 is a layer of epoxy 20 between the surface of chip 12 and that of substrate 18.

EXAMPLES

The invention is demonstrated further by the following illustrative examples. Parts and percentages are by weight unless otherwise indicated. Temperatures are in degrees Centigrade (° C.) unless otherwise specified. The following preparations and examples illustrate the invention but are not intended to limit its scope.

Example 1

A flux composition was prepared by combining the components listed below in the proportions indicated:

| | | |
|---|---|---|
| a) Carboxylic acids | | 8% |
| Stearic acid | 4% | |
| Glycolic acid | 2% | |
| Adipic acid | 2% | |
| b) Carrier fluid | | 92% |
| Ethylene glycol | 76.6% | |
| $HO(CH_2CH_2O)_2H$ | 8.2% | |
| Isopropyl alcohol | 7.2% | |

The above flux composition had a viscosity of about 7000 centipoise at room temperature. A silicon chip with solder bumps on one surface was dipped into a pool of the flux composition described above so that the tips of the solder bumps were wetted with the flux composition. To achieve this, the pool contained a thin layer of the flux composition. Following the above dipping step, the chip was placed on a substrate and subjected to reflow by passing the assembly through a belt furnace. The temperature range was 25 to 350° C. for a period of 5 to 10 minutes. The duration of the period between 250 and 350° C. was less than 90 seconds.

The flux composition prepared as above gave a film of flux residue of about 400 angstroms thick with lead and tin carboxylates and acid anhydride being the main constituents as estimated by Xray Photoelectron Spectroscopy (XPS) and Fourier Transform Infrared (FTIR) and Auger analysis. Subsequently, an anhydride-curing epoxy was dispensed in the region between the chip and the substrate and the epoxy was cured at 30 to 60 minutes or as prescribed by the epoxy manufacturer.

A flux composition was prepared as described above and also included 3% of triethylamine. Use of this flux composition as described above gave similar results.

All publications and patent applications cited in this specification are herein incorporated by reference as if each individual publication or patent application were specifically and individually indicated to be incorporated by reference. A portion of the present disclosure contains material that is subject to copyright protection. The copyright owner has no objection to the facsimile reproduction by anyone of the patent document or the patent disclosure as it appears in the U.S. Patent and Trademark Office patent files or records, but otherwise reserves all copyright rights whatsoever.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. An integrated circuit assembly comprising:
   (a) an integrated circuit comprising a chip attached to a substrate by a plurality of solder joints; and
   (b) a thin layer of residue, interposing the chip and the substrate, that is reactive with an epoxy used in bonding the chip to the substrate, wherein said residue comprises (i) carboxylate salts of the metals comprising said solder alloy and (ii) acid anhydrides.

2. An integrated circuit assembly comprising:
   (a) an integrated circuit comprising a chip attached to a substrate by a plurality of solder joints; and
   (b) a thin layer of residue, interposing the chip and the substrate, that is reactive with an epoxy used in bonding the chip to the substrate, wherein said residue has a thickness not greater than 1000 angstroms.

3. An integrated circuit assembly comprising:
   (a) an integrated circuit comprising a chip attached to a substrate by a plurality of solder joints; and
   (b) a thin layer of residue, interposing the chip and the substrate, that is reactive with an epoxy used in bonding the chip to the substrate, wherein said epoxy is chemically bonded to said residue.

* * * * *